United States Patent [19]
Lee et al.

[11] Patent Number: 6,069,077
[45] Date of Patent: May 30, 2000

[54] UV RESIST CURING AS AN INDIRECT MEANS TO INCREASE SIN CORNER SELECTIVITY ON SELF-ALIGNED CONTACT ETCHING PROCESS

[75] Inventors: Daniel Hao-Tien Lee, Hsinchu; Jun-Cheng Ko, Taichung, both of Taiwan

[73] Assignee: Vanguard International Semiconductor Corporation, Hsin-Chu, Taiwan

[21] Appl. No.: 08/888,636

[22] Filed: Jul. 7, 1997

[51] Int. Cl.[7] ................................... H01L 21/44
[52] U.S. Cl. .................... 438/675; 438/787; 438/791
[58] Field of Search .................. 438/592, 595, 438/623, 688, 675, 780, 253, 254, 624, 640, 641, 642, 672, 572, 951, 738, 800, 706, 791

[56] References Cited

U.S. PATENT DOCUMENTS

| | | | |
|---|---|---|---|
| 4,769,343 | 9/1988 | Fathimulla et al. | 438/572 |
| 5,364,804 | 11/1994 | Ho et al. | 438/595 |
| 5,376,227 | 12/1994 | Lee | 156/643 |
| 5,425,848 | 6/1995 | Haisma et al. | 216/48 |
| 5,525,192 | 6/1996 | Lee et al. | 156/651.1 |
| 5,807,787 | 9/1998 | Fu et al. | 438/623 |
| 5,854,106 | 12/1998 | Wu et al. | 438/253 |

*Primary Examiner*—David Nelms
*Assistant Examiner*—Reneé R. Berry
*Attorney, Agent, or Firm*—George O. Saile; Stephen B. Ackerman; Rosemary L.S. Pike

[57] ABSTRACT

A method of forming a self-aligned contact in the fabrication of an integrated circuit is described. Semiconductor device structures are formed on a semiconductor substrate wherein their top and side surfaces are covered by a silicon nitride layer. A diagonal width of the silicon nitride layer on the side surfaces is a critical dimension. A layer of silicon oxide is deposited over the device structures and contacting the substrate adjacent to at least one of the semiconductor device structures where the self-aligned contact is to be formed. The substrate is covered with a layer of photoresist which is patterned to provide an opening over the planned self-aligned contact. Thereafter, the photoresist is exposed to ultraviolet light whereby the photoresist layer is cured. The silicon oxide is etched away at a high temperature to provide an opening to the silicon substrate using the patterned and cured photoresist and the silicon nitride layer on the side surfaces as a mask wherein the high temperature provides high selectivity of the silicon nitride layer to the silicon oxide layer and wherein the critical dimension is maintained at a thickness sufficient to prevent a short between the semiconductor device structure and a conducting layer to be deposited within the opening. A conducting layer is deposited within the opening to complete the formation of the self-aligned contact.

28 Claims, 4 Drawing Sheets

UV RESIST CURING AS AN INDIRECT MEANS TO INCREASE SIN CORNER SELECTIVITY ON SELF-ALIGNED CONTACT ETCHING PROCESS

BACKGROUND OF THE INVENTION (1) Field of the Invention

The invention relates to the fabrication of integrated circuit devices, and more particularly, to a method of increasing SiN corner selectivity in forming a self-aligned contact opening in the fabrication of integrated circuits.

(2) Description of the Prior Art

The self-aligned contact (SAC) technology has been widely adopted to reduce device area in the fabrication of integrated circuit devices. Referring to FIG. 1, there is illustrated a cross-sectional view of a partially completed integrated circuit device of the prior art. On a semiconductor substrate 10, gate electrode stacks 13 have been formed having a top layer 22 of silicon nitride. Silicon nitride spacers 24 are formed on the sidewalls of the gate electrode stacks. A thick layer of silicon oxide 28 covers the gate electrode stacks. The thickness A of the silicon oxide layer 28 over the gate electrodes stacks is greater than about 4000 Angstroms. It is desirable to have a thinner silicon oxide insulating layer 28 so that the metal contact to be formed will have a lower aspect ratio. A contact opening with a high aspect ratio is difficult to fill completely without voids.

However, a thinner silicon oxide insulating layer of 2500 Angstroms or less produces corner selectivity problems. When the contact opening 31 is etched through the silicon oxide layer 28, a polymer 32 forms on the sidewalls of the silicon oxide layer. This polymer will passivate the silicon nitride corner area 34 and prevent shorting of the metal to be formed within the opening 31 to the gate 13.

If the silicon oxide thickness A above the gate electrode stack is less than about 2500 Angstroms, some of the silicon nitride layers 22 and 24 will be etched away at the corner areas 34, as shown by the dashed line. This will cause the metal contact layer to short to the gate at the corner areas.

To prevent the undesirable etching of the silicon nitride layer 22 at the corners 34, the wafer temperature can be raised to between about 140 to 150° C. This higher temperature prevents etching of the silicon nitride layer at the corners by reducing the etching effect of fluorine ions on the silicon nitride. However, a wafer temperature that high can burn the photoresist material. The photoresist material 30 can tolerate a temperature only as high as 110 to 120° C. This temperature is not high enough to reduce the etching effect of fluorine ions.

U.S. Pat. No. 5,376,227 to Lee shows a multilayer resist process. U.S. Pat. No. 5,425,848 to Haisma et al shows a method of patterning an ultra-violet (UV) cured photoresist. U.S. Pat. No. 5,525,192 to Lee et al uses a resist film that is sensitive to UV rays.

SUMMARY OF THE INVENTION

Accordingly, it is a principal object of the present invention to provide an effective and very manufacturable method of forming a self-aligned contact.

It is a further object of the invention to provide a method of forming a self-aligned contact wherein there is high corner selectivity on silicon nitride.

Yet another object of the invention is to provide a method of treating a photoresist mask so that it can withstand higher than normal wafer temperatures during etching.

A still further object is to provide a method of treating a photoresist mask so that it can withstand higher than normal wafer temperatures during etching so that there is high corner selectivity on silicon nitride during etching to form a self-aligned contact.

In accordance with the objects of this invention a method of forming a self-aligned contact in the fabrication of an integrated circuit is described. Semiconductor device structures are formed on a semiconductor substrate wherein the semiconductor device structures have top and side surfaces and wherein the top and side surfaces are covered by a silicon nitride layer. A diagonal width of the silicon nitride layer on the side surfaces of the semiconductor device structures is a critical dimension. A layer of silicon oxide is deposited over the surface of the substrate and overlying the semiconductor device structures wherein the silicon oxide contacts the semiconductor substrate adjacent to at least one of the semiconductor device structures where the self-aligned contact is to be formed. The substrate is covered with a layer of photoresist which is patterned to provide an opening over the planned self-aligned contact. Thereafter, the photoresist is exposed to ultraviolet light whereby the photoresist layer is cured. The silicon oxide is etched away at a high temperature to provide an opening to the silicon substrate using the patterned and cured photoresist and the silicon nitride layer on the side surfaces of the at least one semiconductor device structure as a mask wherein the high temperature provides high selectivity of the silicon nitride layer to the silicon oxide layer and wherein the critical dimension is maintained at a thickness sufficient to prevent a short between the semiconductor device structure and a conducting layer to be deposited within the opening. A conducting layer is deposited within the opening to complete the formation of the self-aligned contact in the manufacture of an integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application in which a structure is covered by silicon nitride. An overlying dielectric layer is to be etched through with a high selectivity to silicon nitride so that the device is not exposed by etching away of its silicon nitride cover. For purposes of illustration, the invention will be described with reference to FIGS. 2 through 8 which illustrate gate electrode stacks covered by silicon nitride. A contact opening is to be formed between the gate electrode stacks by etching through an overlying silicon oxide layer without etching away the silicon nitride covering the gate electrode stacks. It should be understood by those skilled in the art that the invention is not limited to the embodiment of FIGS. 2 through 8 wherein the structures are gate electrode stacks, but is equally applicable to any structures which are covered by silicon nitride.

Figure 2:
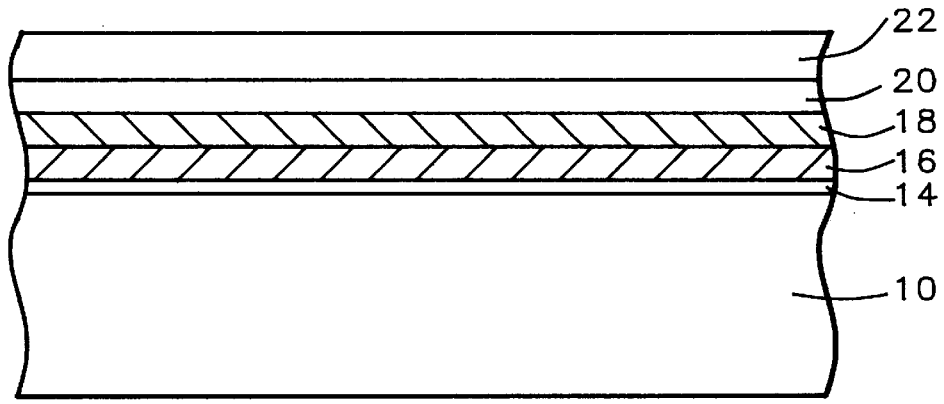
FIGS. 2 through 8 schematically illustrate in cross-sectional representation a preferred embodiment of the present invention.

Referring now more particularly to FIG. 2, there is shown an illustration of a portion of a partially completed metal oxide field effect transistor (MOSFET). The semiconductor substrate 10 is preferably composed of silicon having a (100) crystallographic orientation. In an effort to simplify the description and the drawings the dielectric isolation between devices has been only partially shown and will not be described in detail, because they are conventional.

The surface of the silicon substrate 10 is thermally oxidized to form the desired gate oxide 14 thickness. The preferred thickness typically is between about 90 to 110 Angstroms.

The polysilicon layer 16 is deposited by low pressure chemical vapor deposition (LPCVD) to a typical thickness of between about 800 to 1000 Angstroms. The layer may be doped or ion implanted. Optionally, a tungsten silicide layer 18 may be deposited by chemical vapor deposition (CVD) to a typical thickness of between about 800 to 1000 Angstroms.

Silicon oxide layer 20 is deposited to a typical thickness of between about 300 to 500 Angstroms. A capping layer of silicon nitride 22 is deposited by LPCVD typically to a thickness of between about 1800 and 2000 Angstroms.

Figure 3:
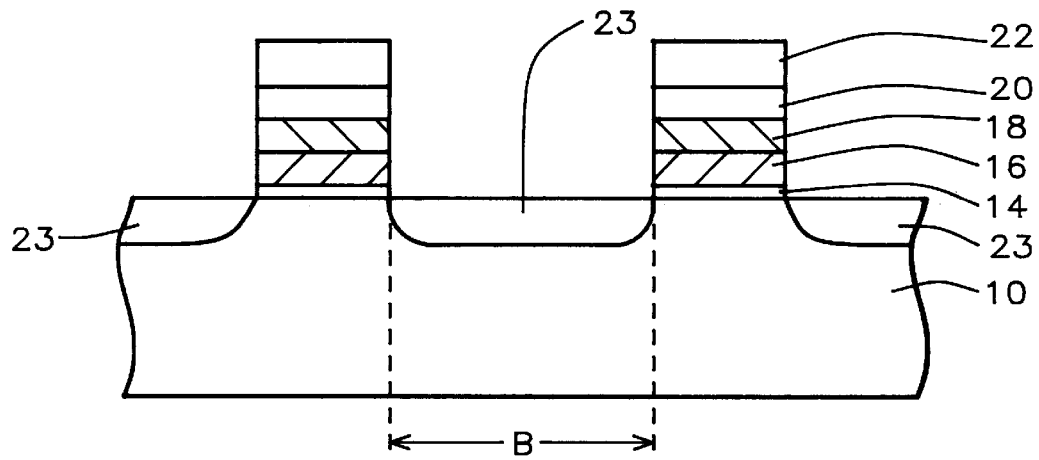

The layers 14, 16, 18, 20, and 22 are patterned by conventional lithography and anisotropic etching techniques to provide a desired pattern of gate electrode stacks as seen in FIG. 3. The spacing B between the gate electrode stacks is 0.1 to 0.2 microns or smaller.

Source and drain regions 23 are now formed within the semiconductor substrate 10 adjacent to the gate electrode stacks, as is conventional in the art.

Figure 4:
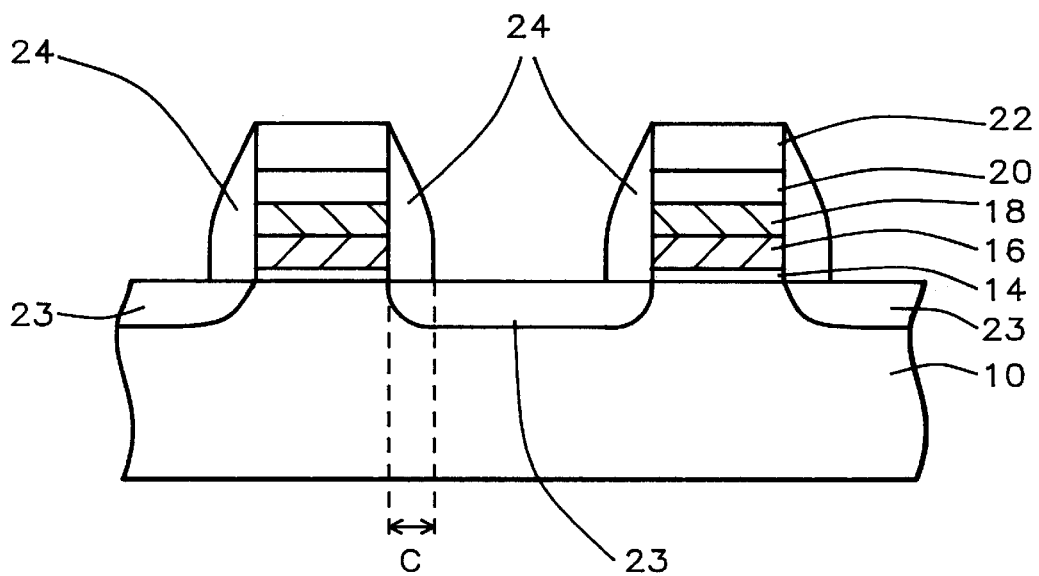

A second layer of silicon nitride is blanket deposited typically to a thickness of between about 800 to 1000 Angstroms over the wafer's exposed surfaces. This layer is etched to form spacers 24 on the sidewalls of the gate electrode stacks, as shown in FIG. 4. The spacers 24 have a width C of about 0.08 microns. After the spacer etching, the capping silicon nitride layer 22 has a thickness of between about 1500 and 2000 Angstroms.

Figure 1:
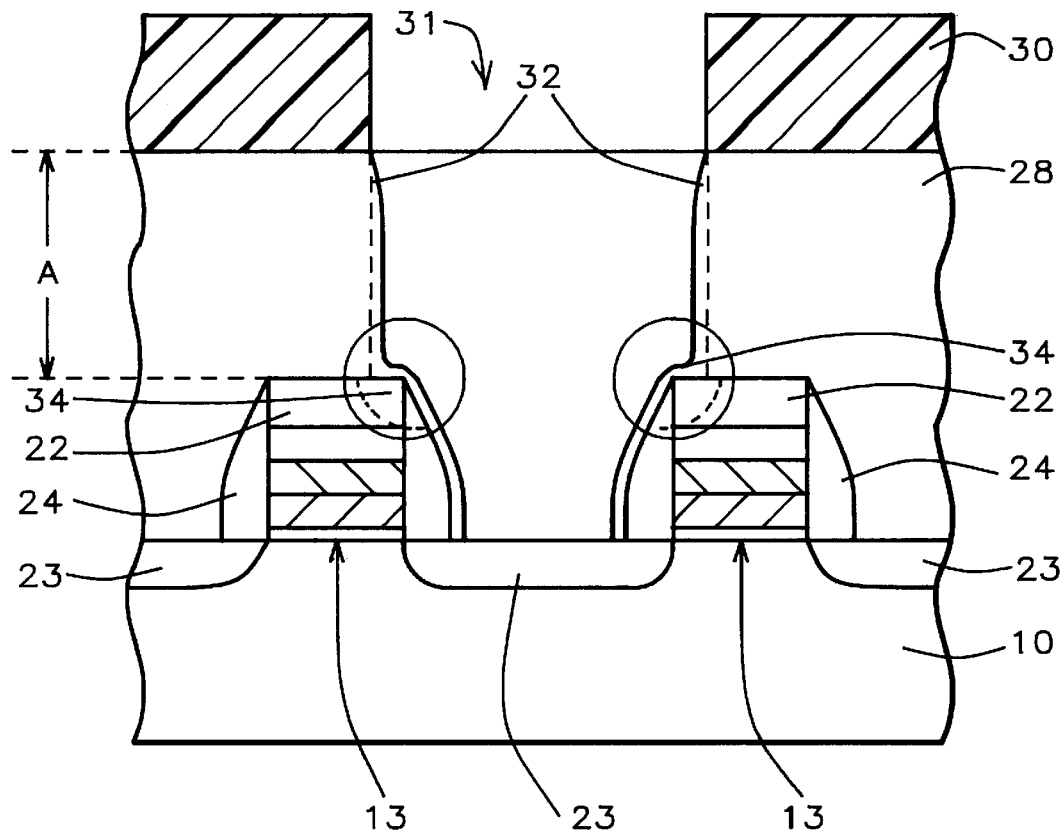
FIG. 1 schematically illustrates in cross-sectional representation a self-aligned contact of the prior art.
Figure 5:
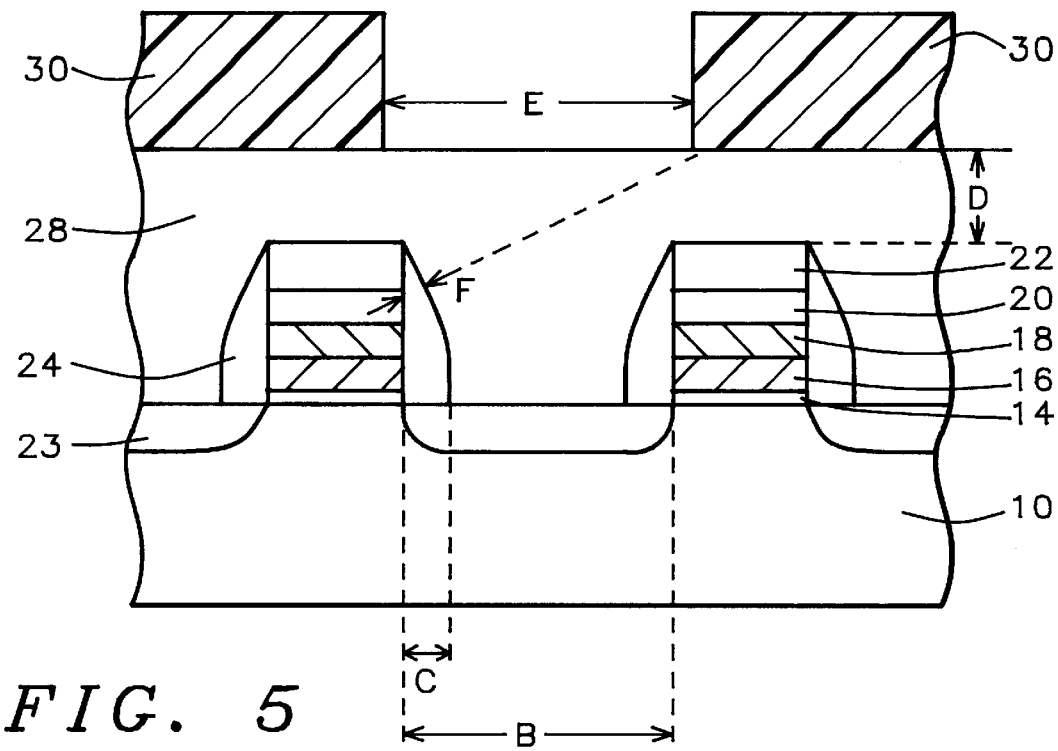

Referring now to FIG. 5, an insulating layer 28 of silicon oxide is deposited by CVD to a thickness of between about 1500 and 2500 Angstroms over the surface of the wafer. This thickness D is smaller than the conventional thickness A in FIG. 1, which is greater than about 4000 Angstroms.

Now, the self-aligned contact photolithography and etching is performed. A layer of photoresist 30 is coated on the surface of the wafer. It is exposed to actinic light, developed and patterned to provide an opening for the planned self-aligned contact. The opening E in the photoresist mask is typically between about 0.25 and 0.35 microns.

The critical dimension is the diagonal spacer width F. This is between about 700 and 900 Angstroms. The critical dimension F must remain greater than about 400 Angstroms after the self-aligned contact etching.

Now the key photoresist mask treatment of the present invention will be described. The wafer is put on a hot plate, or the like, and the wafer temperature is raised to between about 90 and 110° C. Then the photoresist mask is flash exposed to ultraviolet light at a temperature of about 160° C.

Figure 6:
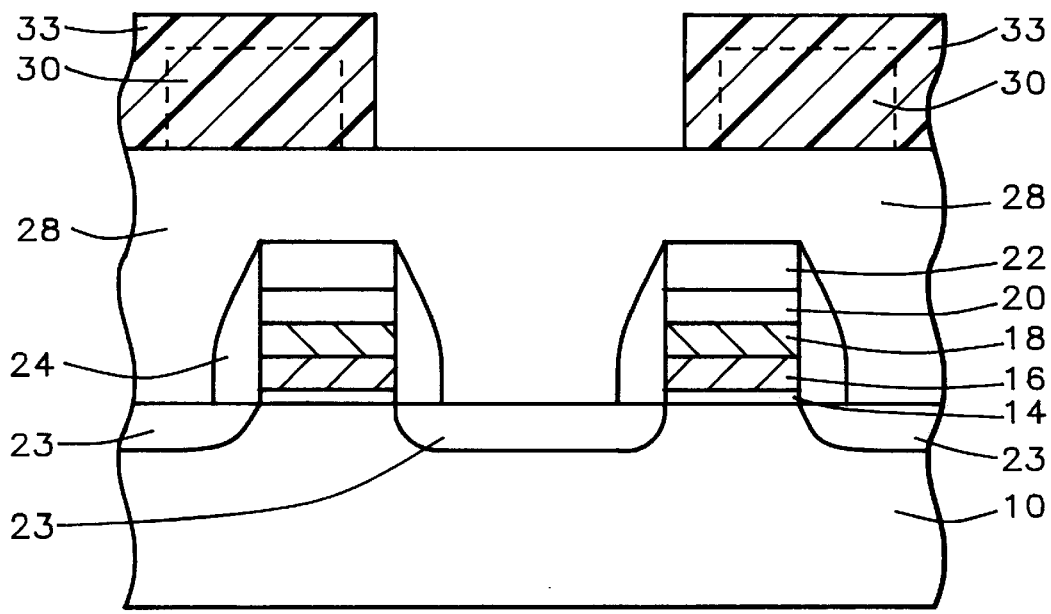

The flash exposure to ultraviolet (UV) light hardens or cures the outer portion 33 of the photoresist mask, as illustrated in FIG. 6. If i-line photolithography is used, a Novalak-based photoresist material should be used. If deep ultraviolet photolithography is used, a polystyrene-based or other photoresist material can be used.

Figure 7:
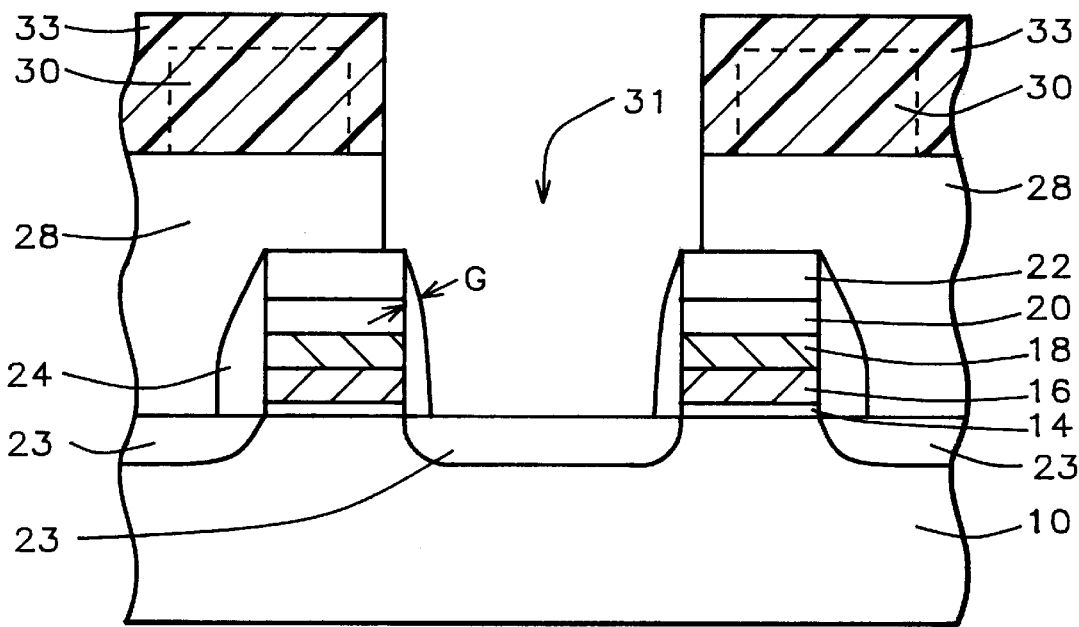

Referring now to FIG. 7, the silicon oxide layer 28 is etched away to form an opening 31 to the substrate using the patterned and cured photoresist 30 and 33 as a mask. Reactive ion etching or the like may be used. Typically, this is a fluorine-based chemistry, such as $C_4F_8$, with carrier gas of Argon, Helium and $CO/CH_3F$ or the like. The etching is performed at a high wafer temperature of between about 140 to 180° C. Conventionally, the etching temperature of the wafer is below about 120° C.

The high temperature etching of the present invention is possible because the partially cured photoresist material will not burn at that temperature. The high temperature etching allows a silicon oxide insulating layer thickness of as small as between about 1500 and 2500 Angstroms while maintaining good corner selectivity. After etching, the critical dimension G in FIG. 7 is between about 400 and 500 Angstroms. A smaller critical dimension would cause shorting of the gate to the metal contact layer filling the contact opening.

A polymer forms within the contact opening as in the prior art, but is removed after completion of the contact opening, as illustrated in FIG. 7.

Figure 8:
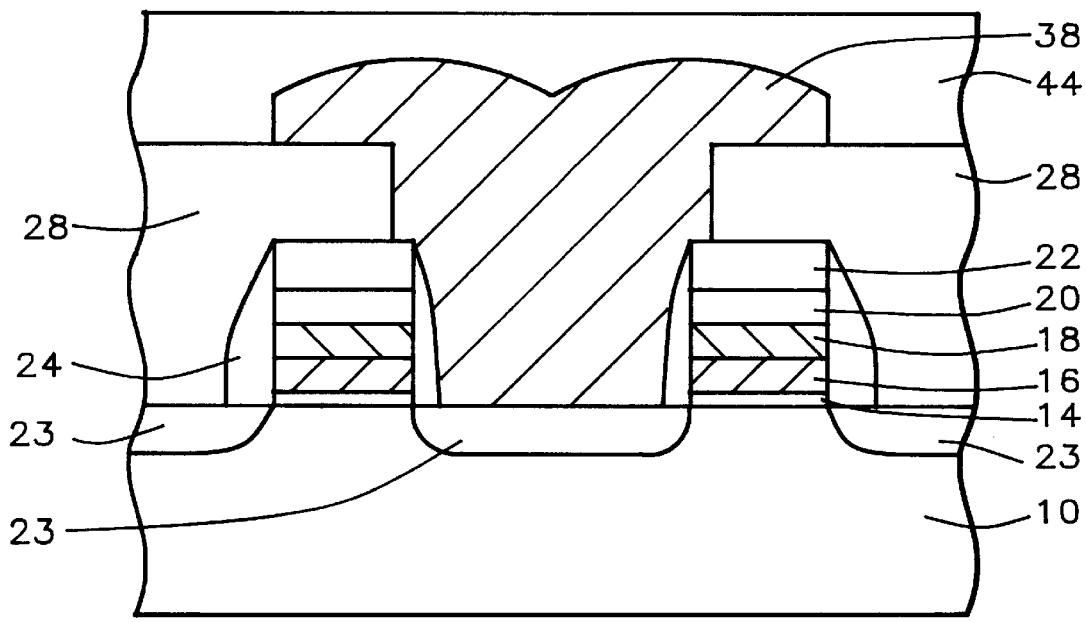

Referring now to FIG. 8, the photoresist mask 30 is removed and a conducting layer 38 is deposited over the surface of the insulating layer and within the contact opening to contact source/drain region 23. The conducting layer may be polysilicon or a metal such as tungsten, aluminum, or the like. The conducting layer is patterned, as shown, and covered with passivation layer 44 to complete fabrication of the integrated circuit device.

The process of the present invention provides a very manufacturable method of photoresist curing that allows for a high temperature etching of a self-aligned contact opening. The high temperature etching increases the silicon nitride to oxide etching selectivity by between about 80 to 100% over the prior art without photoresist curing. The process of the present invention can be used in any application in which high silicon nitride to oxide etching selectivity is desired and can be achieved by high temperature etching. The photoresist curing method of the present invention allows the photoresist to withstand the high etching temperatures without burning.

While the invention has been particularly shown and described with reference to the preferred embodiments thereof, it will be understood by those skilled in the art that various changes in form and details may be made without departing from the spirit and scope of the invention.

What is claimed is:

1. A method of forming a self-aligned contact in the fabrication of an integrated circuit comprising:

forming semiconductor device structures on a semiconductor substrate wherein said semiconductor device structures have top and side surfaces and wherein said top and side surfaces are covered by a silicon nitride layer;

depositing a layer of silicon oxide over the surface of said substrate and overlying said semiconductor device structures wherein said silicon oxide contacts said semiconductor substrate adjacent to at least one of said semiconductor device structures where said self-aligned contact is to be formed;

covering said substrate with a layer of photoresist and patterning said photoresist to provide an opening over planned said self-aligned contact;

thereafter curing said photoresist layer;

etching away said silicon oxide at a high wafer temperature of between 140 and 180° C. to provide an opening to said silicon substrate using said patterned and cured photoresist and said silicon nitride layer on the side surfaces of said at least one semiconductor device structure as a mask; and depositing a conducting layer within said opening to complete said self-aligned contact in the manufacture of said integrated circuit device.

2. The method according to claim 1 wherein said semiconductor device structures are gate electrode stacks and wherein said self-aligned contact is to be made between said gate electrode stacks to a source/drain region within said semiconductor substrate.

3. The method according to claim 1 wherein said silicon nitride layer on the top surfaces of said semiconductor device structures has a thickness of between about 1500 and 2000 Angstroms.

4. The method according to claim 1 wherein said silicon nitride layer on the side surfaces of said semiconductor device structures has a thickness of between about 800 and 1000 Angstroms.

5. The method according to claim 1 wherein said silicon nitride layer on the side surfaces of said semiconductor device structures has a diagonal critical dimension of between about 700 and 900 Angstroms before said etching.

6. The method according to claim 1 wherein said silicon nitride layer on the side surfaces of said semiconductor device structures has a diagonal critical dimension of between about 400 and 500 Angstroms after said etching.

7. The method according to claim 1 wherein the thickness of said silicon oxide layer overlying said semiconductor device structures is between about 1500 and 2500 Angstroms.

8. The method according to claim 1 wherein said curing of said photoresist comprises exposing said photoresist to ultraviolet light.

9. The method according to claim 1 wherein said curing of said photoresist enables said photoresist to withstand higher temperatures than can uncured photoresist.

10. The method according to claim 1 wherein said etching away of said silicon oxide layer comprises fluorine based etching chemistry with a carrier gas.

11. A method of forming a self-aligned contact in the fabrication of an integrated circuit comprising:

forming semiconductor device structures on a semiconductor substrate wherein said semiconductor device structures have top and side surfaces and wherein said top and side surfaces are covered by a silicon nitride layer and wherein the diagonal width of said silicon nitride layer on the side surfaces of said semiconductor device structures is a critical dimension;

depositing a layer of silicon oxide over the surface of said substrate and overlying said semiconductor device structures wherein said silicon oxide contacts said semiconductor substrate adjacent to at least one of said semiconductor device structures where said self-aligned contact is to be formed;

covering said substrate with a layer of photoresist and patterning said photoresist to provide an opening over planned said self-aligned contact;

thereafter exposing said photoresist layer to ultraviolet light whereby said photoresist layer is cured;

etching away said silicon oxide at a high temperature to provide an opening to said silicon substrate using said patterned and cured photoresist and said silicon nitride layer on the side surfaces of said at least one semiconductor device structure as a mask wherein said high temperature provides high selectivity of said silicon nitride layer to said silicon oxide layer whereby said critical dimension of said silicon nitride layer is maintained at a thickness sufficient to prevent a short between said semiconductor device structure and a conducting layer to be deposited within said opening; and depositing said conducting layer within said opening to complete said self-aligned contact in the manufacture of said integrated circuit device.

12. The method according to claim 11 wherein said semiconductor device structures are gate electrode stacks and wherein said self-aligned contact is to be made between said gate electrode stacks to a source/drain region within said semiconductor substrate.

13. The method according to claim 11 wherein said silicon nitride layer on the top surfaces of said semiconductor device structures has a thickness of between about 1500 and 2000 Angstroms.

14. The method according to claim 11 wherein said silicon nitride layer on the side surfaces of said semiconductor device structures has a thickness of between about 800 and 1000 Angstroms.

15. The method according to claim 11 wherein said critical dimension is between about 700 and 900 Angstroms before said etching.

16. The method according to claim 11 wherein said critical dimension is between about 400 and 500 Angstroms after said etching.

17. The method according to claim 11 wherein said the thickness of said silicon oxide layer overlying said semiconductor device structures is between about 1500 and 2500 Angstroms.

18. The method according to claim 11 wherein said curing of said photoresist enables said photoresist to withstand higher temperatures than can uncured photoresist.

19. The method according to claim 11 wherein said etching away of said silicon oxide layer is performed at a high temperature of between about 140 and 180° C.

20. The method according to claim 11 wherein said etching away of said silicon oxide layer comprises fluorine based etching chemistry with a carrier gas.

21. A method of forming a self-aligned contact in the fabrication of an integrated circuit comprising:

forming semiconductor device regions in and on a semiconductor substrate wherein said semiconductor device regions include gate electrode stacks on the surface of said semiconductor substrate and source/drain regions within said semiconductor substrate and wherein the topmost layer of said gate electrode stacks is a silicon nitride layer;

forming silicon nitride spacers on the sidewalls of said gate electrode stacks wherein a diagonal width of said silicon nitride spacers is a critical dimension;

depositing a layer of silicon oxide over the surface of said substrate wherein said silicon oxide contacts said source/drain regions within said substrate between said gate electrode stacks;

covering said substrate with a layer of photoresist and patterning said photoresist to provide an opening over planned said self-aligned contact between said gate electrode stacks;

thereafter exposing said photoresist to ultraviolet light whereby said photoresist layer is cured;

etching away said silicon oxide at a high temperature to provide an opening to said silicon substrate using said patterned and cured photoresist and said sidewall spacers as a mask wherein said high temperature provides high selectivity of said silicon nitride topmost layer and said silicon nitride spacers to said silicon oxide layer whereby said critical dimension of said silicon nitride spacers is maintained at a thickness sufficient to prevent a short between said semiconductor device structure and a conducting layer to be deposited within said opening; and depositing said conducting layer within said opening to complete said self-aligned contact in the manufacture of said integrated circuit device.

22. The method according to claim 21 wherein said silicon nitride layer on the top surfaces of said semiconductor device structures has a thickness of between about 1500 and 2000 Angstroms.

23. The method according to claim 21 wherein said silicon nitride layer on the side surfaces of said semiconductor device structures has a thickness of between about 800 and 1000 Angstroms.

24. The method according to claim 21 wherein said critical dimension is between about 700 and 900 Angstroms before said etching.

25. The method according to claim 21 wherein said critical dimension is between about 400 and 500 Angstroms after said etching.

26. The method according to claim 21 wherein said the thickness of said silicon oxide layer overlying said semiconductor device structures is between about 1500 and 2500 Angstroms.

27. The method according to claim 21 wherein said etching away of said silicon oxide layer is performed at said high temperature of between about 140 and 180° C.

28. The method according to claim 21 wherein said etching away of said silicon oxide layer comprises fluorine based etching chemistry with a carrier gas.

* * * * *